United States Patent
Oda (10) Patent No.: US 7,834,304 B2
(45) Date of Patent: Nov. 16, 2010

(54) IMAGING DEVICE

(75) Inventor: Masahiro Oda, Itami (JP)

(73) Assignee: Sanyo Electric Co., Ltd., Osaka (JP)

( * ) Notice: Subject to any disclaimer, the term of this patent is extended or adjusted under 35 U.S.C. 154(b) by 779 days.

(21) Appl. No.: 11/782,220

(22) Filed: Jul. 24, 2007

(65) Prior Publication Data

US 2008/0024636 A1 Jan. 31, 2008

(30) Foreign Application Priority Data

Jul. 27, 2006 (JP) .............................. 2006-204188

(51) Int. Cl.
*H01L 27/00* (2006.01)
*H01J 40/14* (2006.01)

(52) U.S. Cl. .................. 250/208.1; 250/214.1; 250/207; 348/300; 257/292

(58) Field of Classification Search ............. 250/208.1, 250/214.1, 214 VT, 207; 348/297, 300, 301, 348/308, 311; 257/223, 229, 292
See application file for complete search history.

(56) References Cited

U.S. PATENT DOCUMENTS

| 6,278,142 | B1 | 8/2001 | Hynecek |
| 6,862,333 | B2 | 3/2005 | Kashima et al. |
| 2007/0278537 | A1 | 12/2007 | Haraguchi |
| 2008/0018959 | A1 | 1/2008 | Sawada et al. |
| 2009/0134437 | A1* | 5/2009 | Nakashima et al. ......... 257/292 |

FOREIGN PATENT DOCUMENTS

| GB | 2 323 471 A | 9/1998 |
| JP | 10-304256 A | 11/1998 |
| JP | 2001-127277 A | 5/2001 |
| JP | 3483261 | 10/2003 |
| JP | 2003-347317 A | 12/2003 |
| JP | 2004-165467 | 6/2004 |
| JP | 2007-324801 A | 12/2007 |
| JP | 2006-204188 | 7/2008 |
| WO | WO 2006/068107 A1 | 6/2006 |

OTHER PUBLICATIONS

R.M. Guidash et al., "A 0.6 μm CMOS Pinned Photodiode Color Imager Technology," IEEE, 1997.

* cited by examiner

*Primary Examiner*—Kevin Pyo
(74) *Attorney, Agent, or Firm*—Ditthavong, Mori & Steiner, P.C.

(57) ABSTRACT

An imaging device includes a storage portion of carriers, a multiplier section having a multiplier electrode multiplying carriers, a holding portion of the carriers and a readout electrode of carriers, wherein the multiplier electrode is set to an OFF-state potential and carriers are transferred to the holding portion after the potential of the readout electrode is set to an ON-state potential, and the ON-state potential of the readout electrode is maintained at least until a signal corresponding to the carriers transferred to the holding portion is read.

20 Claims, 9 Drawing Sheets

IMAGING DEVICE

BACKGROUND OF THE INVENTION

1. Field of the Invention

The present invention relates to an imaging device.

CROSS-REFERENCE TO RELATED APPLICATIONS

The priority application number JP2006-204188, Imaging Device, Jul. 27, 2006, Masahiro Oda, upon which this patent application is based is hereby incorporated by reference.

2. Description of the Background Art

Figure 11:
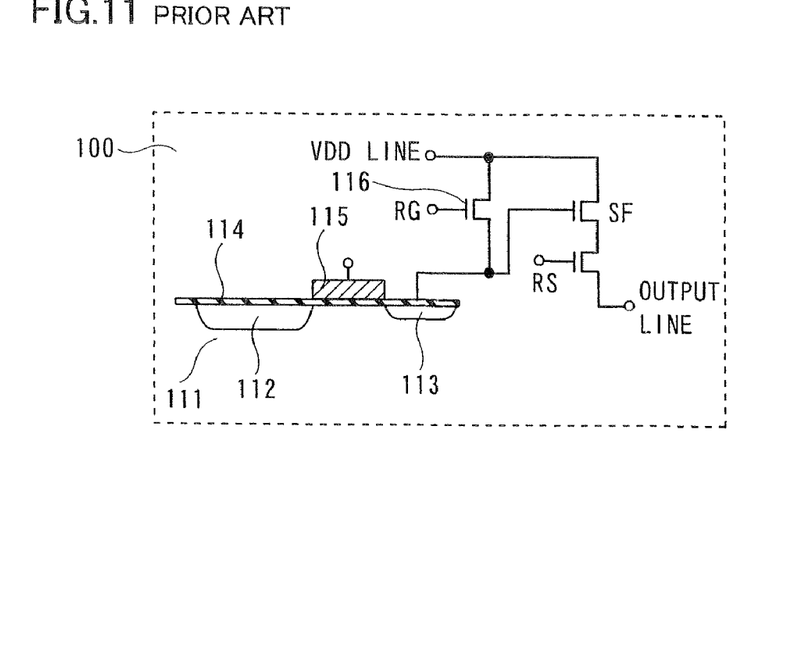
FIG. 11 is a sectional view showing a structure of a pixel of a conventional CMOS imaging device.
Figure 12:
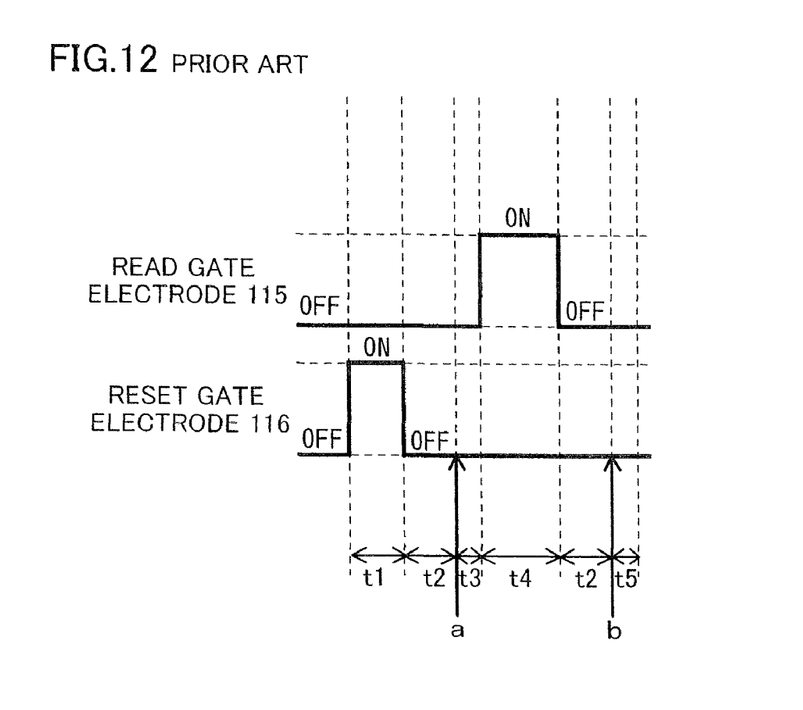
FIG. 12 is a signal waveform diagram of a read operation period in the conventional general CMOS imaging device.

A CMOS imaging device is known in general. FIG. 11 is a sectional view showing a structure of a pixel of a conventional CMOS imaging device. FIG. 12 is a signal waveform diagram of a read operation period in the conventional general CMOS imaging device. As shown in FIG. 11, each of pixels 100 of the conventional CMOS imaging device comprises a photodiode portion 112 having a photoelectric conversion function on a silicon substrate 111 and storing carries generated by photoelectric conversion, a floating diffusion 113 holding carriers, a gate insulating film 114, a read gate electrode 115 formed on the gate insulating film 114 and having a function of transferring carriers from the photodiode portion 112 to the floating diffusion 113. Each pixel 100 of the conventional CMOS imaging device comprises a reset transistor RG including a reset gate electrode 116 initializing a potential of the floating diffusion 113, an amplification transistor SF for amplifying a signal read from the floating diffusion 113 and a selection transistor RS selecting a pixel to be read. The floating diffusion 113 is connected to the source of a reset gate transistor RG, while a power supply potential (VDD) line is connected to the drain of the reset gate transistor RG. The floating diffusion 113 is connected to a gate of the amplification transistor SF, while the drain of the selection transistor RS is connected to the source of the amplification transistor SF. The power supply potential (VDD) line is connected to the drain of the amplification transistor SF. An output line is connected to the source of the selection transistor RS. The conventional CMOS imaging device having a structure shown in FIG. 11 is generally so formed that the respective pixels 100 are arranged in the form of a matrix and read signals are collectively read for each row.

With reference to FIGS. 11 and 12, a signal read operation of the conventional general CMOS imaging device will be described. First, as shown in FIG. 12, carriers stored in the floating diffusion 113 are discharged to the power supply potential (VDD) line by setting the reset gate electrode 116 to an ON-state potential in a period t1. After the reset gate electrode 116 is set to an OFF-state potential and a potential stabilization time t2 for stabilizing the potential of the reset gate electrode 116 elapses, a signal at a time when the floating diffusion 113 is initialized at a time of "a" shown in FIG. 12 is output. After a overlap margin t3 provided for suppressing overlap of signal readout and the next signal elapses, carriers stored in the photodiode portion 112 is transferred to the floating diffusion 113 by setting the read gate electrode 115 to an ON-state potential in a period 4. After the read gate electrode 115 is set to an OFF-state potential and a potential stabilization time t2 for stabilizing the potential of the read gate electrode 115 elapses, a signal at a time when the carriers transferred from the photodiode portion 112 are read at a time of "b" shown in FIG. 12 is output. After a margin t5 until which the pixels 100 in the next row is read elapses, a read operation for the pixels in the next row is started.

In the aforementioned conventional general CMOS imaging device, however, ON/OFF operations of the readout electrode are performed in the read operation, whereby the time for stabilizing the readout electrode is required. Consequently, the time for reading a signal is disadvantageously increased. In the conventional general CMOS imaging device, the sensitivity of pixels is desired to be improved.

SUMMARY OF THE INVENTION

An imaging device according to a first aspect of the present invention comprises a storage portion for storing carriers generated by photoelectric conversion, having a photoelectric conversion function, a multiplier section including a multiplier electrode applying an electric field for multiplying carriers due to impact ionization by an electric field, a holding portion holding carriers and a readout electrode for reading carriers from the multiplier section to the holding portion, wherein the multiplier electrode is set to an OFF-state potential and carriers are transferred to the holding portion after the potential of the readout electrode is set to an ON-state potential, and the ON-state potential of the readout electrode is maintained at least until a signal corresponding to the carriers transferred to the holding portion is read.

An imaging device according to a second aspect of the present invention comprises storage means for storing carriers generated by photoelectric conversion, having a photoelectric conversion function, multiplying means including a multiplier electrode applying an electric field for multiplying carriers due to impact ionization by an electric field, holding means holding carriers, and a readout electrode for reading carriers from the multiplier means to the holding means, wherein the multiplier electrode is set to an OFF-state potential and carriers are transferred to the holding means after the potential of the readout electrode is set to an ON-state potential, and the ON-state potential of the readout electrode is maintained at least until a signal corresponding to the carriers transferred to the holding means is read.

DESCRIPTION OF THE PREFERRED EMBODIMENTS

Embodiments of the present invention will be now described with reference to the drawings.

A structure of the imaging device according to an embodiment will be now described with reference to FIGS. 1 to 4. While electrons and holes are considered as carriers, the carriers are described as electrons in the following description.

Figure 1:
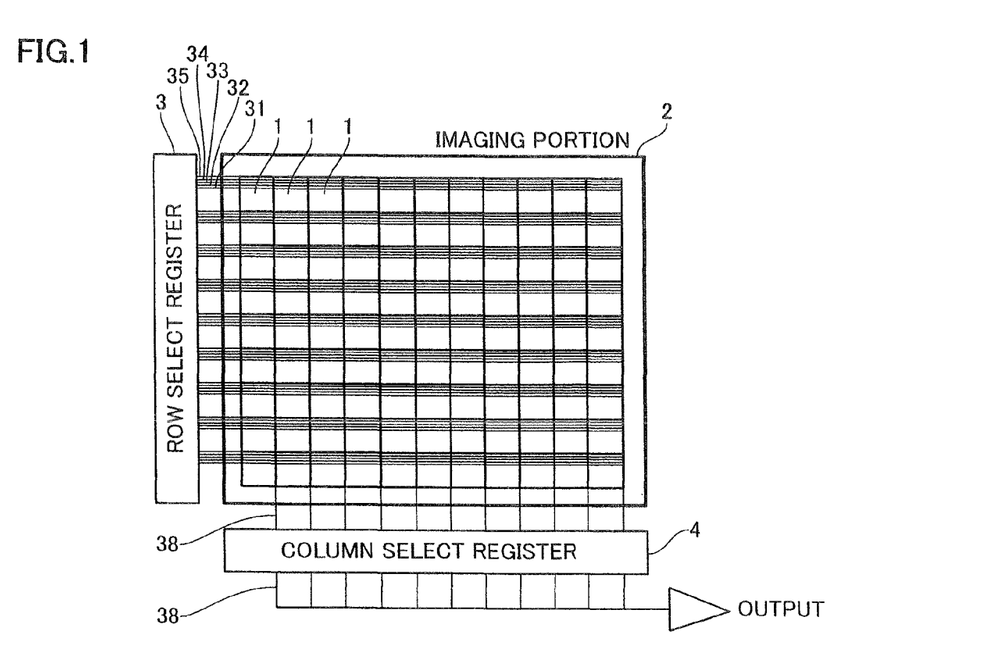
FIG. 1 is a plan view showing an overall structure of an imaging device according to an embodiment of the present invention.
Figure 2:
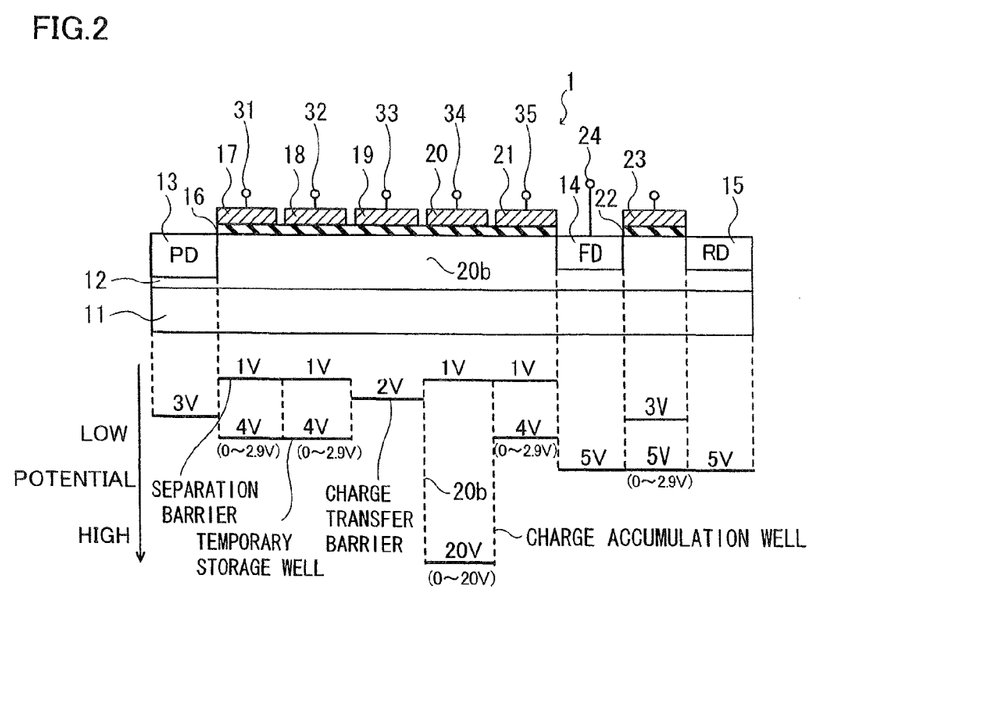
FIG. 2 is a sectional view showing a structure of the imaging device according to the embodiment of the present invention shown in FIG. 1.
Figure 3:
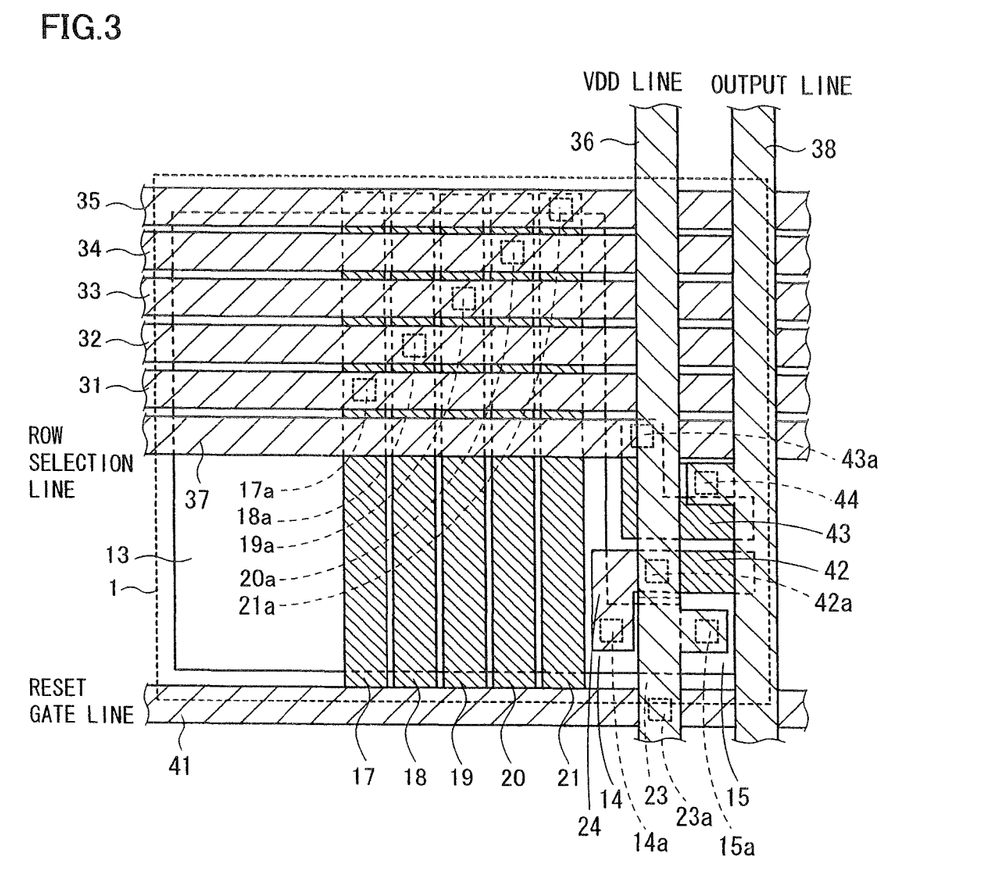
FIG. 3 is a plan view showing a pixel of the imaging device according to the embodiment of the present invention shown in FIG. 1.

The CMOS imaging device according to this embodiment comprises an imaging portion 2 including a plurality of pixels 1, a row select register 3 and a column select register 4 as shown in FIG. 1. As shown in FIGS. 2 and 3, the plurality of pixels 1 are arranged on a surface of a p-type well region 12 on a surface of a p-type silicon substrate 11 in the form of a matrix. The range surrounded by a dotted line in FIG. 3 is a unit pixel. Each one pixel 1 is provided with a photodiode portion (PD) 13 consisting of an n-type impurity region, a floating diffusion 14 consisting of the n-type impurity region and a reset drain (RD) 15 consisting of the n-type impurity region on the surface of the p-type well region 12 on the p-type silicon substrate 11 at prescribed intervals as shown in FIG. 2. The photodiode portion 13 is an example of the "storage portion" in the present invention, and the floating diffusion 14 is an example of the "holding portion" in the present invention. Transfer gate electrodes 17, 18 and 19, a multiplication gate electrode 20 and a read gate electrode 21 are formed on the p-type well region 12 between each photodiode portion 13 and each floating diffusion 14 through a gate insulating film 16 at prescribed intervals, respectively. The transfer gate electrodes 17 and 18 are the "first transfer electrode" and the "third transfer electrode" in the present invention respectively. The transfer gate electrode 19 is an example of the "second transfer electrode" in the present invention. The multiplication gate electrode 20 is an example of the "multiplier electrode" in the present invention. The read gate electrode 21 is an example of the "readout electrode" in the present invention. A reset gate electrode 23 is formed on the surface of the p-type well region 12 between each floating diffusion 14 and each reset drain 15 through the gate insulating film 22. The reset gate electrode 23 is an example of the "reset electrode" in the present invention. A signal line 24 for extracting signals is electrically connected to each floating diffusion 14.

As shown in FIG. 3, wiring layers 31, 32, 33, 34 and 35 for supplying clock signals for voltage control are electrically connected to the transfer gate electrodes 17, 18 and 19, the multiplication gate electrode 20 and the read gate electrode 21 through contact portions 17a, 18a, 19a, 20a and 21a respectively. The signal lines 24 for extracting signals are electrically connected to the floating diffusions 14 through the contact portions 14a respectively.

As shown in FIG. 2, each photodiode portion 13, which is adjusted to a potential of about 3 V, has a function of generating electrons by photoelectric conversion and storing the generated electrons. Each floating diffusion 14, which is adjusted to a potential of about 5 V, has a function of holding electrons multiplied in the multiplier section 20b formed under the multiplication gate electrode 20. Each reset drain 15, which is adjusted to a potential of about 5 V, has a function as a discharging portion of electrons held in the floating diffusion 14.

As shown in FIG. 2, an ON signal (high-level signal) of a clock signal is supplied to the transfer gate electrodes 17, the transfer gate electrodes 18, the multiplication gate electrodes 20 and the read gate electrodes 21, whereby a voltage of about 2.9 V is applied to the transfer gate electrodes 17, the transfer gate electrodes 18 and the read gate electrodes 21 when in an ON-state, and a voltage of about 20 V is applied to the multiplication gate electrodes 20 when in an ON-state. Thus, the p-type well regions 12 located under the transfer gate electrodes 17, the p-type well regions 12 located under the transfer gate electrodes 18 and the p-type well regions 12 located under the read gate electrodes 21 are adjusted to a potential of about 4 V where in an ON-state, and the p-type well regions 12 located under the multiplication gate electrodes 20 are adjusted to a high potential of about 20V when in an ON-state. In a state where an OFF signal (low-level signal) of the clock signal is supplied, the p-type well regions 12 located under the transfer gate electrodes 17, the p-type well regions 12 located under the transfer gate electrodes 18, the p-type well regions 12 located under the multiplication gate electrodes 20 and the p-type well regions 12 located under the read gate electrodes 21 are adjusted to an OFF state potential of about 1 V. A constant voltage is always applied to the transfer gate electrodes 19 and the p-type well regions 12 located under the transfer gate electrodes 19 are always adjusted to a potential of about 2 V.

The CCD image sensor is so formed that four-phase clock signals are supplied to the transfer gate electrodes 17, 18, 19 and the multiplication gate electrodes 20. As shown in FIG. 2, a separation barrier, a temporary storage wells and a charge transfer barrier are formed in the p-type well regions 12 located under each of the transfer gate electrodes 17, 18 and 19 respectively. A charge accumulation well is formed in the p-type well region 12 located under each multiplication gate electrode 20. Each separation barrier formed under the transfer gate electrode 17 has a function of inhibiting electrons generated by the photodiode portion 13 from being mixed into the temporary storage well formed under the transfer gate electrode 18. Each temporary storage well formed under the transfer gate electrode 18 has a function of temporarily storing transferred electrons when the electrons generated by the photodiode portion 13 are transferred. Each charge transfer barrier formed under the transfer gate electrode 19 has a function of separating the temporary storage well formed under the transfer gate electrode 18 and the charge accumulation well formed under the multiplication gate electrode 20 and transferring electrons stored in the temporary storage well to the charge accumulation well formed under the multiplication gate electrode 20. Further, each charge accumulation well formed under the multiplication gate electrode 20 has a function of storing electrons transferred from the temporary storage well formed under the transfer gate electrode 18 and also has a function as the multiplier section 20b for multiplying electrons due to impact ionization by an electric field. In other words, a high electric field region adjusted to a high potential is formed in an interface between each charge transfer barrier formed under the transfer gate electrode 19 and each charge accumulation well formed under the multiplication gate electrode 20, and when the electrons stored in each temporary storage well formed under the transfer gate electrode 18 is injected into the high electric field region, the injected electrons obtain energy from the high electric field region. Then, the electrons having obtained the energy collide with atoms of each p-type well region 12 during movement in the high electric field region, and electrons and holes are generated by this impact. Among the generated electrons and holes, only the electrons are accumulated in each charge accumulation well formed under the multiplication gate electrode 20 by the electric field in the high electric field region. Thus, the electrons are multiplied.

Figure 4:
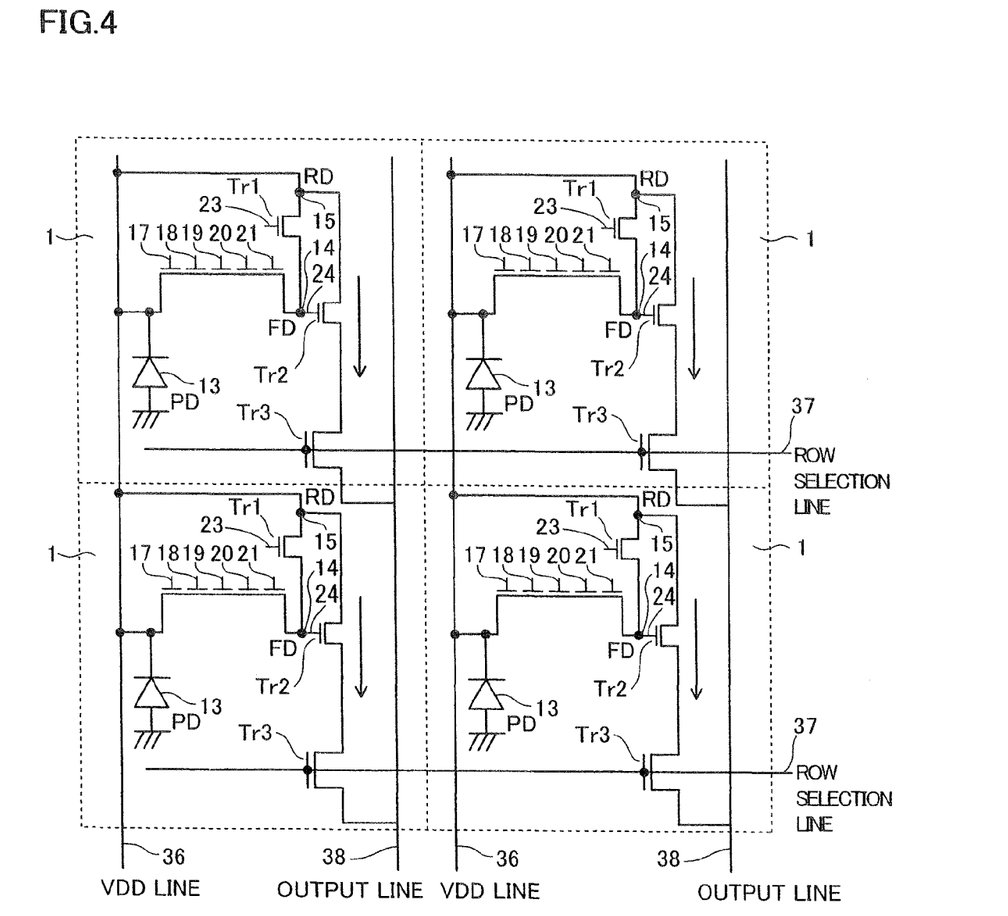
FIG. 4 is a circuit diagram showing the structure of the imaging device according to the embodiment of the present invention shown in FIG. 1.

As shown in FIG. 4, each of the pixels 1 comprises the transfer gate electrodes 17, 18 and 19, the multiplication gate electrode 20, the read gate electrode 21, and a reset gate transistor Tr1 including the reset gate electrode 23, an amplification transistor Tr2 and a pixel selection transistor Tr3. The photodiode portions 13 are connected to the transfer gate electrodes 17. As shown in FIG. 3, the reset gate lines 41 are connected to the reset gate electrodes 23 of the reset gate transistors Tr1 through the contact portions 23a, to which reset signals are supplied The drains (reset drains 15) of the reset gate transistors Tr1 are connected to power supply potential (VDD) lines 36 through contact portions 15a. As shown in FIG. 3, the floating diffusions 14 constituting sources of the reset gate transistors Tr1 and the sources of the read gate electrodes 21 and gates 42 of the amplification transistors Tr2 are connected to each other via the signal lines 24 through the contact portions 14a and 42a. As shown in FIG. 4, the drains of the amplification transistors Tr2 are connected to power supply potential lines 36 and the drains of the pixel selection transistors Tr3 are connected to the sources of the amplification transistors Tr2. As shown in FIG. 3, row selection lines 37 are connected to gates 43 of the pixel selection transistors Tr3 through contact portions 43a and output lines 38 are connected to the sources of the pixel selection transistors Tr3 through contact portions 44.

An operation in an imaging period of the imaging device according to the embodiment of the present invention will be now described with reference to FIG. 5.

Figure 5:
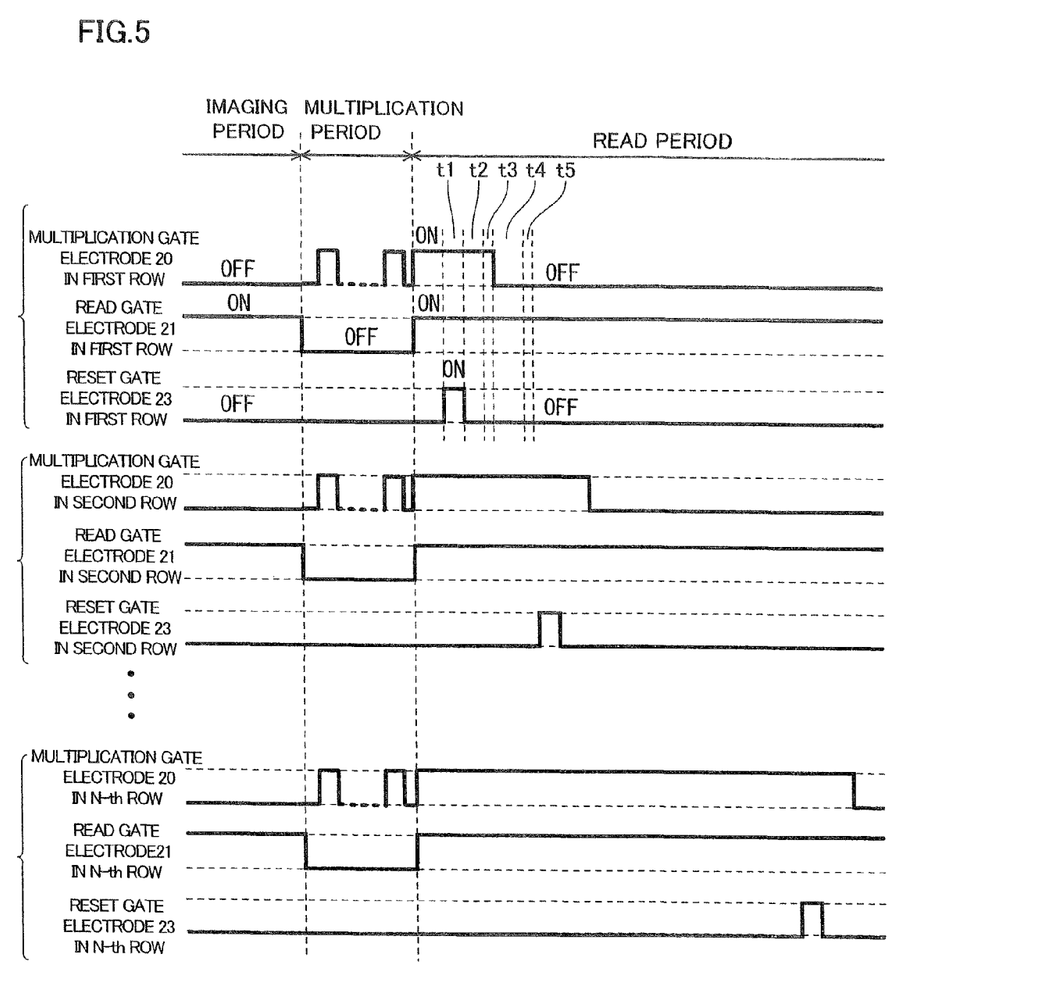
FIG. 5 is a signal waveform diagram showing an operation of the imaging device according to the embodiment of the present invention shown in FIG. 1.
Figure 7:
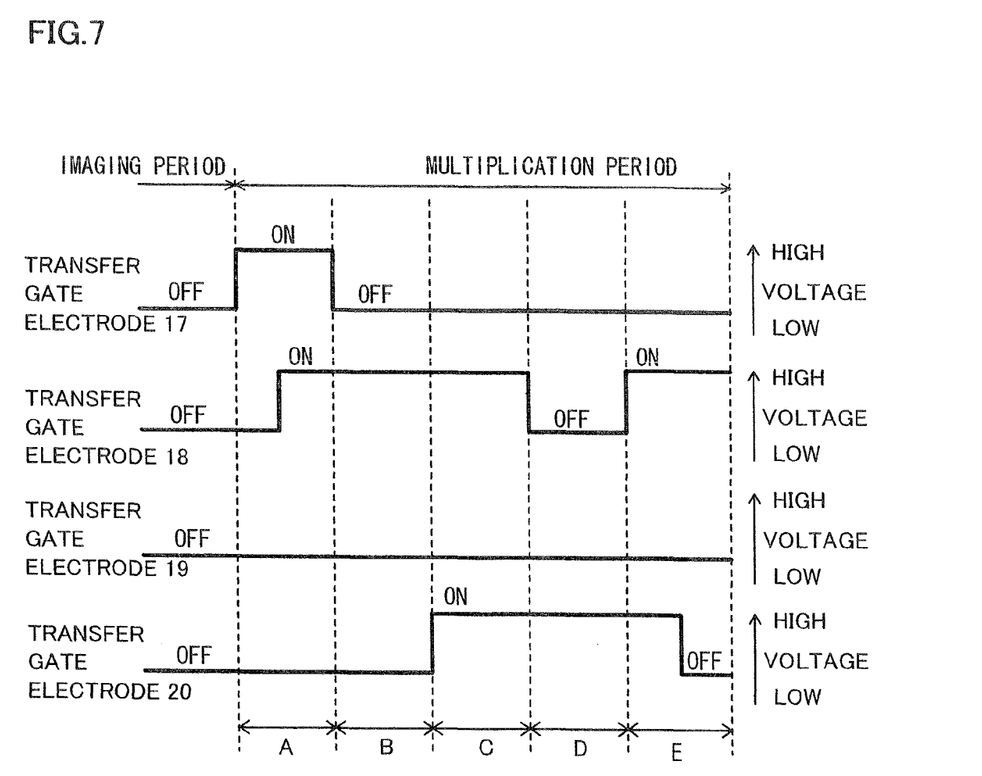
FIG. 7 is a signal waveform diagram showing the multiplication operation of the imaging device according to the embodiment of the present invention shown in FIG. 1.

As shown in FIG. 5, during the imaging period, the multiplication gate electrodes 20 and the reset gate electrodes 23 are at the OFF-state potential, while the read gate electrodes 21 are at the ON-state potential. As shown in FIG. 7 described later, the transfer gate electrodes 17, 18, 19 and the multiplication gate electrodes 20 are at the OFF-state potential during the imaging period. Electrons generated by photoelectric conversion during the imaging period are stored in the photodiode portions 13.

Figure 6:
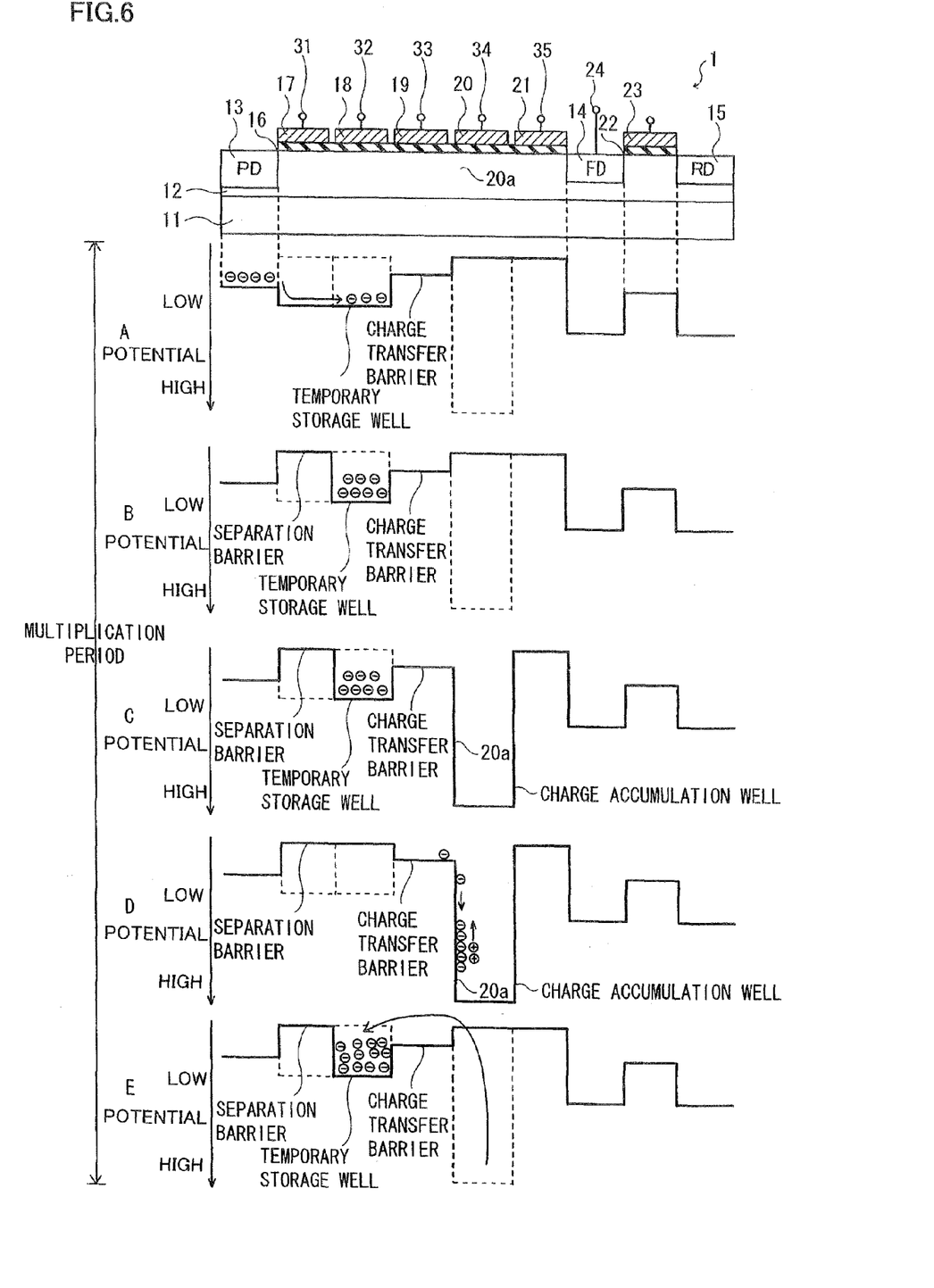
FIG. 6 is a sectional view for illustrating a multiplication operation of electrons in the imaging device according to the embodiment of the present invention shown in FIG. 1.

An operation in a multiplication period of the imaging device according to the embodiment of the present invention will be now described with reference to FIGS. 5 to 7.

As shown in FIG. 5, during the multiplication period, a prescribed clock signal is applied to the multiplication gate electrodes 20, and the read gate electrodes 21 and the reset gate electrodes 23 are at the OFF-state potential. As shown in FIGS. 6 and 7, in a period A, the transfer gate electrodes 17 are set to the ON-state potential and the transfer gate electrodes 18 are set to the ON-state potential after the lapse of a prescribed time after the transfer gate electrodes 17 are set to the ON-state potential. Thus, as shown in FIG. 6, electrons transferred from the photodiode portions 13 are transferred to the temporary storage wells formed under the transfer gate electrodes 18 over the separation barriers under the transfer gate electrodes 17 lowering due to the ON-state potential of the transfer gate electrodes 17.

In a period B, the transfer gate electrodes 17 are set to the OFF-state potential and the transfer gate electrodes 18 remain at the ON-state potential, whereby the electrons transferred in the period A are stored in the temporary storage wells formed under the transfer gate electrodes 18.

In a period C, the multiplication gate electrodes 20 are set to the ON-state potential, whereby a high voltage is applied to the multiplication gate electrodes 20 to form the charge accumulation wells and high electric field regions (multiplier sections 20b) are formed on interfaces between the charge transfer barriers formed under the transfer gate electrodes 19 and the charge accumulation wells formed under the multiplication gate electrodes 20.

In a period D, the multiplication gate electrodes 20 remain at the ON-state potential and the transfer gate electrodes 18 are set to the OFF-state potential, whereby the electrons stored in the temporary storage wells formed under the transfer gate electrodes 18 are transferred to the charge accumulation wells formed under the multiplication gate electrodes 20 over the charge transfer barriers formed under the transfer gate electrodes 19. Thus, the transferred electrons are multiplied due to impact ionization by high electric fields in the multiplier sections 20b, and the multiplied electrons are stored in the charge accumulation wells formed under the multiplication gate electrodes 20.

In a period E, the multiplication gate electrodes 20 are set to the OFF-state potential and the transfer gate electrodes 18 are set to the ON-state potential, whereby the electrons stored in the charge accumulation wells formed under the multiplication gate electrodes 20 are transferred to the temporary storage wells formed under the transfer gate electrodes 18 over the charge transfer barriers formed under the transfer gate electrodes 19. Thereafter electrons are multiplied by performing the periods C and D again. Thus, the multiplication of the electrons is repeated by repeatedly performing the periods C to E many times.

Figure 8:
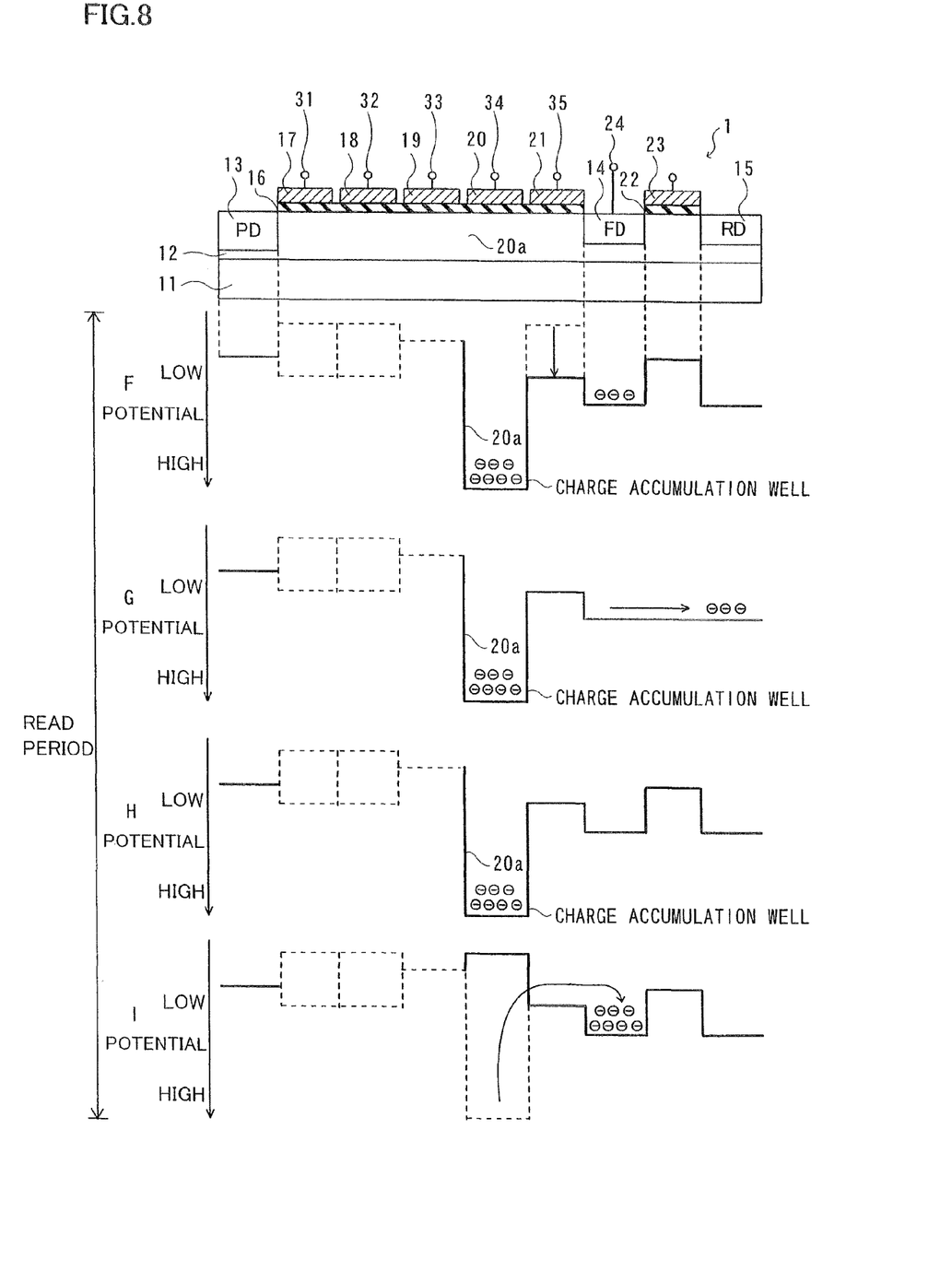
FIG. 8 is a sectional view for illustrating an operation during a read period of the electrons in the imaging device according to the embodiment of the present invention shown in FIG. 1.
Figure 9:
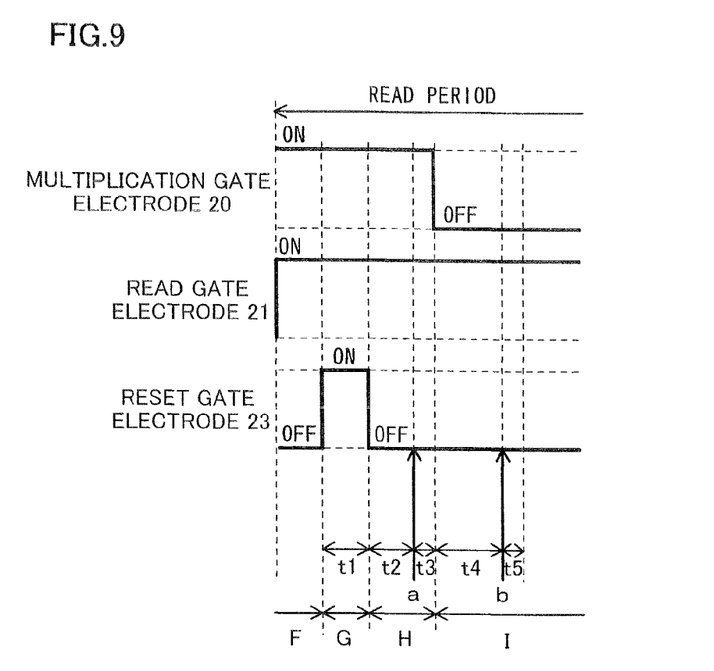
FIG. 9 is an enlarged view of a read period of the signal waveform diagram showing the operation of the imaging device according to the embodiment of the present invention shown in FIG. 5.

An operation during a read period of the imaging device according to the embodiment of the present invention will be now described with reference to FIGS. 5, 8 and 9.

As shown in FIG. 5, when the read period starts, the read gate electrodes 21 change to the ON-state potential. As shown in FIGS. 8 and 9, in a period F, the multiplication gate electrodes 20 and the read gate electrodes 21 are at the ON-state potential and the reset gate electrodes 23 are at the OFF-state potential. At this time, the electrons multiplied during the multiplication period are stored in the charge accumulation wells formed under the multiplication gate electrodes 20.

In a period G, the reset gate electrodes 23 are set from the OFF-state potential to the ON-state potential while maintaining the read gate electrodes 21 at the ON-state potential, whereby the electrons stored in the floating diffusions 14 are discharged to the reset drains 15 and the floating diffusions 14 are initialized.

In a period H, the reset gate electrodes 23 are set to the OFF-state potential while maintaining the ON-state potential of the read gate electrodes 21. A period t1 shown in FIG. 9 is the time during which the reset gate electrodes 23 are set from the ON-state potential to the OFF-state potential. After the period t1, a potential stabilization time t2 of the reset gate electrodes 23 and the overlap margin t3 suppressing overlap when generating the next signal elapse. After the potential stabilization time t2 of the reset gate electrodes 23 (at a time of "a" shown in FIG. 9), charge signals of the initialized floating diffusions 14 are read as a voltage signal by the amplification transistors Tr2 through the signal lines 24.

In a period I, the multiplication gate electrodes 20 are set to the OFF-state potential while maintaining the ON-state potential of the read gate electrodes 21, whereby the electrons stored in the charge accumulation wells formed under the multiplication gate electrodes 20 are transferred to the floating diffusions 14. Thereafter charge signals by the electrons stored in the floating diffusions 14 are read as a voltage signal by the amplification transistors Tr2 through the signal lines 24 at a time of "b" shown in FIG. 9 while maintaining the ON-state potential of the read gate electrodes 21. After reading the signals, a margin t5, until which a read operation of pixels in the next row is operated, elapses while maintaining the ON-state potential of the read gate electrodes 21. Thereafter a read operation of the pixels in the next row is started. According to this embodiment, as hereinabove described, the ON-state potential of the read gate electrodes 21 is maintained during the read period.

According to this embodiment, as hereinabove described, the imaging device comprises the multiplication gate electrodes 20 each applying an electric field for multiplying electrons due to impact ionization by an electric field, whereby impact ionization of electrons can be caused in an image sensor. Thus, the number of electrons can be multiplied. Consequently, sensitivity of the pixels 1 can be improved. The multiplication gate electrodes 20 are set to the OFF-state potential and electrons are transferred to the floating diffusions 14 after the potential of the read gate electrodes 21 is set to the ON-state potential, and the ON-state potential of the read gate electrodes 21 is maintained at least until the signals corresponding to the electrons transferred to the floating diffusions 14 are read, whereby the stabilization time t2 of the read gate electrodes 21 caused by turning on/off the read gate electrodes 21 during the read period of the electrons is not required. Thus, the time for reading carriers can be reduced. Consequently, the time for reading signals can be inhibited from increase.

According to this embodiment, as hereinabove described, the imaging device further comprises the reset gate electrodes 23 each initializing the potential of the floating diffusion 14 and the read gate electrode 21 is so formed as to be set to the ON-state potential before initializing the floating diffusions 14 are read. If the potential of the read gate electrodes 21 are set to the ON-state potential after initializing the floating diffusions 14, when the read gate electrodes 21 are turned on, the potential of the floating diffusions 14 is changed due to capacitance coupling of the read gate electrodes 21 and the floating diffusions 14 to become higher than the potential at the time of initialization. In this case, a phenomenon where gradation is lost in a dark image occurs, since an output signal of each floating diffusions 14 is regarded as zero until carriers at the time of the initialization are stored in each floating diffusion 14. According to this embodiment, the potential of the read gate electrodes 21 is at the ON-state potential even before the initialization of the floating diffusions 14, whereby the potential of the floating diffusions 14 can be inhibited from being changed. Thus, an excellent image without the phenomenon where gradation is lost in a dark image can be obtained.

According to this embodiment, as hereinabove described, the multiplier sections 20b are arranged to be adjacent to the read gate electrodes 21, whereby distances between the multiplier sections 20b and the read gate electrode 21 are small, whereby the electrons stored in the multiplier sections 20b can be easily transferred to the p-type well regions located under the read gate electrodes 21.

According to this embodiment, as hereinabove described, the imaging device further comprises the transfer gate electrodes 17, 18 and 19 for transferring electrons from the photodiode portions 13 to the multiplier sections 20b, the read gate electrodes 21 are so formed as to be set to the OFF-state potential during the multiplication period in which the electrons are repeatedly multiplied between the multiplier sections 20b and the transfer gate electrodes 18 and 19, whereby the potential barriers under the read gate electrodes 21 can be higher than the potential barriers under the transfer gate electrodes 19 of during the multiplication period. Even if electrons is repeatedly multiplied between the multiplier sections 20b and the transfer gate electrodes 18 and 19 during the multiplication period, the multiplied electrons can be inhibited from being mixed into the floating diffusions 14 over the potential barriers under the read gate electrodes 21.

Although the present invention has been described and illustrated in detail, it is clearly understood that the same is by way of illustration and example only and is not to be taken by way of limitation, the spirit and scope of the present invention being limited only by the terms of the appended claims.

For example, while electrons are used as carriers in the aforementioned embodiments, the present invention is not restricted to this but holes may be alternatively used as carriers by making a conductive type of a substrate impurity and a polarity of an applied voltage opposite.

While the p-type silicon substrate is employed as a substrate in the aforementioned embodiment, the present invention is not restricted to this but the n-type impurity region formed on an n-type silicon substrate may be alternatively employed as a substrate.

While the three transfer gate electrodes are formed in the aforementioned embodiment, the present invention is not restricted to this but transfer gate electrodes other than the three transfer gate electrodes may be alternatively employed.

Figure 10:
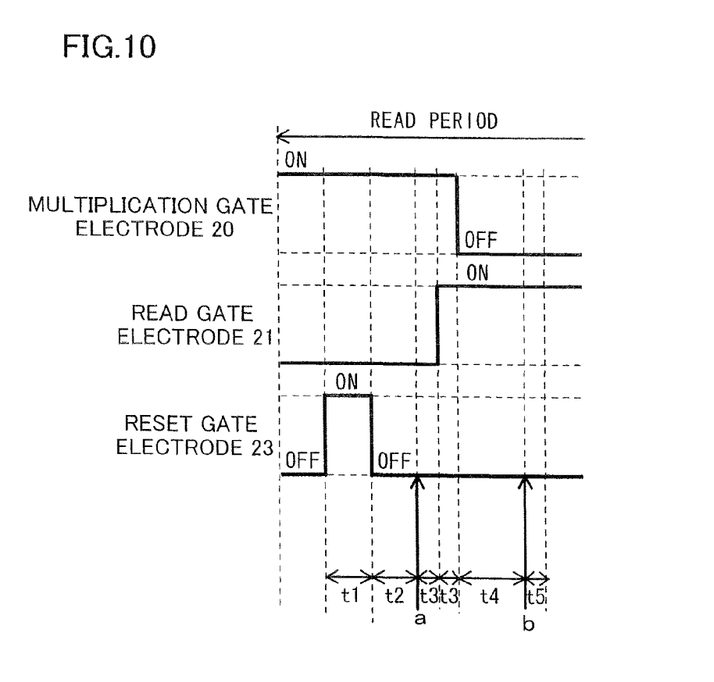
FIG. 10 is a signal waveform diagram showing an operation of the read period of the imaging device according to a modification of the embodiment of the present invention.

While the read gate electrodes are set to the ON-state potential during the entire read period before setting the reset gate electrodes to the ON-state potential in the aforementioned embodiment, the present invention is not restricted to this but the read gate electrodes may alternatively set to the ON-state potential after setting the reset gate electrodes to the OFF-state potential and before setting the multiplication gate electrodes to the OFF-state potential as a modification shown in FIG. 10. In this case, an overlap margin t3 inhibiting a signal setting each reset gate electrode to the OFF-state potential and a signal setting each read gate electrode to the ON-state potential from overlapping with each other is increased as compared with the read period of the aforementioned embodiment. This overlap margin t3, however, is shorter than the stabilization time t2 required for setting the read gate electrodes to the OFF-state potential in the read period in the conventional general CMOS imaging device shown in FIG. 12. Thus, the time for reading in this modification can be inhibited from increase as compared with the conventional imaging device.

What is claimed is:

1. An imaging device comprising:
 a storage portion for storing carriers generated by photoelectric conversion, having a photoelectric conversion function;
 a multiplier section including a multiplier electrode applying an electric field for multiplying carriers due to impact ionization by an electric field;
 a holding portion holding carriers; and
 a readout electrode for reading carriers from said multiplier section to said holding portion, wherein
 said multiplier electrode is set to an OFF-state potential and carriers are transferred to said holding portion after the potential of said readout electrode is set to an ON-state potential, and the ON-state potential of said readout electrode is maintained at least until a signal corresponding to said carriers transferred to said holding portion is read.

2. The imaging device according to claim 1, further comprising a reset electrode initializing the potential of said holding portion, wherein
the potential of said readout electrode is an ON-state potential before initialization of said holding portion.

3. The imaging device according to claim 1, wherein
said multiplier section is so arranged as to be adjacent to said readout electrode.

4. The imaging device according to claim 1, wherein
multiplication of carriers performed by said multiplier section is performed a plurality of times.

5. The imaging device according to claim 4, further comprising a transfer electrode for transferring carriers from said storage portion to said multiplier section, wherein
the potential of said readout electrode is an OFF-state potential during a multiplication period in which multiplication of carriers is performed between said multiplier section and said transfer electrode a plurality of times.

6. The imaging device according to claim 5, wherein
said transfer electrode includes a first transfer electrode adjacent to said storage portion, a second transfer electrode adjacent to said multiplier electrode, a third transfer electrode arranged between said first transfer electrode and said second transfer electrode.

7. The imaging device according to claim 6, wherein
the potential of said third transfer electrode and the potential of said multiplier electrode are alternately repeatedly set to an ON-state and an OFF-state during said multiplication period so that multiplication of carriers is performed.

8. The imaging device according to claim 6, wherein
said first transfer electrode is so formed as to be set to an OFF-state potential during said multiplication period.

9. The imaging device according to claim 6, wherein
the potential of said second transfer electrode is fixed to a potential between the ON-state potential and the OFF-state potential of said third transfer electrode during said multiplication period.

10. The imaging device according to claim 9, wherein
the ON-state potential of said multiplier electrode is higher than the potential of said second transfer electrode and the ON-state potential of said readout electrode.

11. The imaging device according to claim 9, wherein
the potential of said second transfer electrode is higher than the OFF-state potential of said readout electrode and the OFF-state potential of said multiplier electrode, and the OFF-state potential of said readout electrode and the OFF-state potential of said multiplier electrode are substantially equal to each other.

12. The imaging device according to claim 9, wherein
the potential of said second transfer electrode is hither than the OFF-state potential of said first transfer electrode.

13. The imaging device according to claim 9, wherein
the potential of said readout electrode is higher than the potential of said second transfer electrode and the OFF-state potential of said multiplier electrode when carriers are read from said multiplier section to said holding portion.

14. The imaging device according to claim 1, wherein
the ON-state potential of said holding portion is higher than the ON-state potential of said readout electrode.

15. The imaging device according to claim 1, wherein
carriers are multiplied by said multiplier section and said multiplied carriers are stored under said multiplier electrode.

16. The imaging device according to claim 1, wherein
the potential of said readout electrode maintained in said ON-state is lower than the potential of said holding portion.

17. The imaging device according to claim 1, wherein
at least said storage portion, said multiplier section having said multiplier electrode, said holding portion and said readout electrode are included in one pixel.

18. The imaging device according to claim 1, wherein
said imaging device is constituted by a CMOS.

19. An imaging device comprising:
storage means for storing carriers generated by photoelectric conversion, having a photoelectric conversion function;
multiplying means including a multiplier electrode applying an electric field for multiplying carriers due to impact ionization by an electric field;
holding means holding carriers; and
a readout electrode for reading carriers from said multiplier means to said holding means, wherein
said multiplier electrode is set to an OFF-state potential and carriers are transferred to said holding means after the potential of said readout electrode is set to an ON-state potential, and the ON-state potential of said readout electrode is maintained at least until a signal corresponding to said carriers transferred to said holding means is read.

20. The imaging device according to claim 1, further comprising a reset electrode initializing the potential of said holding portion, wherein
the potential of said readout electrode is set to an ON-state potential after initialization of said holding portion.

* * * * *